United States Patent [19]

Howard

[11] 4,041,383
[45] Aug. 9, 1977

[54] METHOD FOR MATCHING WIRES IN MULTIPLE WIRE CONDUITS

[75] Inventor: James Lynn Howard, Lancaster, S.C.

[73] Assignee: Earl Cooper Phifer, Stanfield, N.C.; a part interest

[21] Appl. No.: 673,660

[22] Filed: Apr. 5, 1976

[51] Int. Cl.² .......................................... G01R 31/02
[52] U.S. Cl. ................................................ 324/66
[58] Field of Search .................... 324/66, 51; 179/175.3 A

[56] References Cited

U.S. PATENT DOCUMENTS

| 2,822,519 | 2/1958 | Murphy | 324/66 |
| 2,964,701 | 12/1960 | Argabright | 324/66 X |

FOREIGN PATENT DOCUMENTS

| 1,142,660 | 6/1961 | Germany | 324/66 |
| 709,737 | 6/1954 | United Kingdom | 324/66 |
| 130,580 | 11/1959 | U.S.S.R. | 324/66 |

Primary Examiner—Gerard R. Strecker
Attorney, Agent, or Firm—Bell, Seltzer, Park & Gibson

[57] ABSTRACT

The corresponding opposite end portions of wires at opposite ends of a multi-wire conduit are matched in accordance with this invention with the use of a direct current circuit tester in conjunction with a plurality of diodes, one for each of the wires to be identified in the multi-wire conduit. The diodes have respective pairs of leads which are electrically connected in series in alternating polarity. The diodes are connected to the wires at one end of the conduit and the direct current circuit tester is applied to the wires at the opposite end of the conduit according to a specified procedure to identify or match the corresponding opposite ends of the respective wires.

2 Claims, 7 Drawing Figures

METHOD FOR MATCHING WIRES IN MULTIPLE WIRE CONDUITS

This invention relates to a device and method for facilitating matching the corresponding ends of wires located at opposite ends of a multi-wire conduit.

When installing a plurality of electrical conductors in a conduit it is necessary that the corresponding opposite end portions of the conductors be identified so that the proper electrical connections thereto can be made. In many instances this is done by color coding, employing wires having various colors of insulation. However, where a large number of wires are involved or where the number of available colors is limited, color coding is inadequate.

In such instances, the corresponding opposite ends of the wires must be manually identified. This normally involves two persons working together at opposite ends of the conduit. However, various kinds of devices have been provided for facilitating accomplishing this task, some of which enable a person working alone to identify or match the wires.

By way of example, one known type of device is described in U.S. Pat. No. 2,666,898, and employs resistors connected to the wires at one end of the conduit and an ohmmeter at the opposite end of the conduit. However, this device and the other devices which are commercially available for this purpose generally employ fragile or expensive instruments, such as meters, which can be easily damaged, and are thus not particularly suited for use on a construction site. Also, the operation of such devices is somewhat complicated, and considerable training, often with an understanding of electronic theory, is necessary before a workman can use the device with any assurance of accuracy.

With the foregoing in mind, it is a primary object of the present invention to provide a device and method for matching wires in a multi-wire conduit which involves a relatively simple procedure which may be easily mastered by an electrician or other workman.

It is another object of the present invention to provide a device and method of the type described which does not require any sensitive or fragile instruments, and which is thus well suited for being used on a construction site.

It is another object of the present invention to provide a device for matching wires in a multi-wire conduit which is simpler and more reliable than the other devices which are commercially available for this purpose.

It is another object of the present invention to provide a device and method of the type described having great flexibility so as to be suited for identifying any number of wires.

The above and other objects of this invention are accomplished with the present invention by providing a device and method wherein a plurality of diodes, electrically interconnected in series and in alternating polarity, are connected to the wires at one end of the conduit and a direct current circuit tester is employed in a particular manner at the opposite end of the conduit for accurately identifying and matching the wires.

More particularly, the method of the present invention involves the following steps:

a. connecting corresponding leads of the respective series-interconnected diodes to a predetermined number of the wires at one end of the conduit, b. connecting the free lead of the first diode of the series to a common ground connection, c. connecting to the common ground connection at the opposite end of the conduit the lead of a first circuit tester having a polarity corresponding to the polarity of the grounded free end of the first diode, d. applying the other lead of the circuit tester to the unidentified wires at the opposite end of the conduit until a wire is located which completes the circuit on the circuit tester, thus indicating a match with the wire connected to the first diode of the series at said one end of the conduit, e. connecting the thus located wire to said first lead of the circuit tester, f. actuating the polarity reversing switch to thereby reverse the polarity of the leads of the circuit tester, g. applying said second lead of the circuit tester to the then remaining unidentified wires until a wire is located which completes the circuit on the circuit tester, thus indicating a match with the wire connected to the next diode of the series at said one end of the conduit, and h. repeating steps (e), (f), and (g) until all of the predetermined number of wires have been identified.

The preferred method of matching wires in accordance with this invention also involves applying identification labels to the wires at the one end of the conduit when the diodes are connected thereto. Thereafter, at the opposite end of the conduit, each time a wire is identified a label is applied thereto corresponding to one of the labeled wires at the opposite end of the conduit. Thus, when the procedure is completed, the wires at each end of the conduit are labeled with corresponding identification labels.

The preferred apparatus of the invention includes a diode assembly adapted to be connected to the respective wires at one end of the conduit and a direct current circuit tester adapted to be employed at the opposite end of the conduit to test the respective wires for a complete circuit. The diode assembly includes a plurality of diodes having respective pairs of leads electrically interconnected in series in alternating polarity, means for temporarily connecting the corresponding leads of the respective series-interconnected diodes to the respectivve wires at one end of the conduit, and means for connecting the remaining free lead of the first diode of the series to a common ground connection.

The direct current circuit tester includes a pair of test leads, a battery, and an indicator all electrically interconnected and operable for indicating the occurrence of a complete circuit between the respective test leads. Means is associated with one of the test leads for facilitating applying the lead to each of the unidentified wires, and means is associated with the other test lead for permitting temporarily connecting the lead initially to a common ground connection for identifying the first of the wires and subsequently to each previously identified wire each time a wire is identified. Switch means is operatively associated with the test leads for permitting reversing the polarity of the test leads each time a wire is identified.

Some of the objects and features of the invention having been stated, others will appear as the description proceeds when taken in connection with the accompanyingdrawings, in which.

Figure 1:
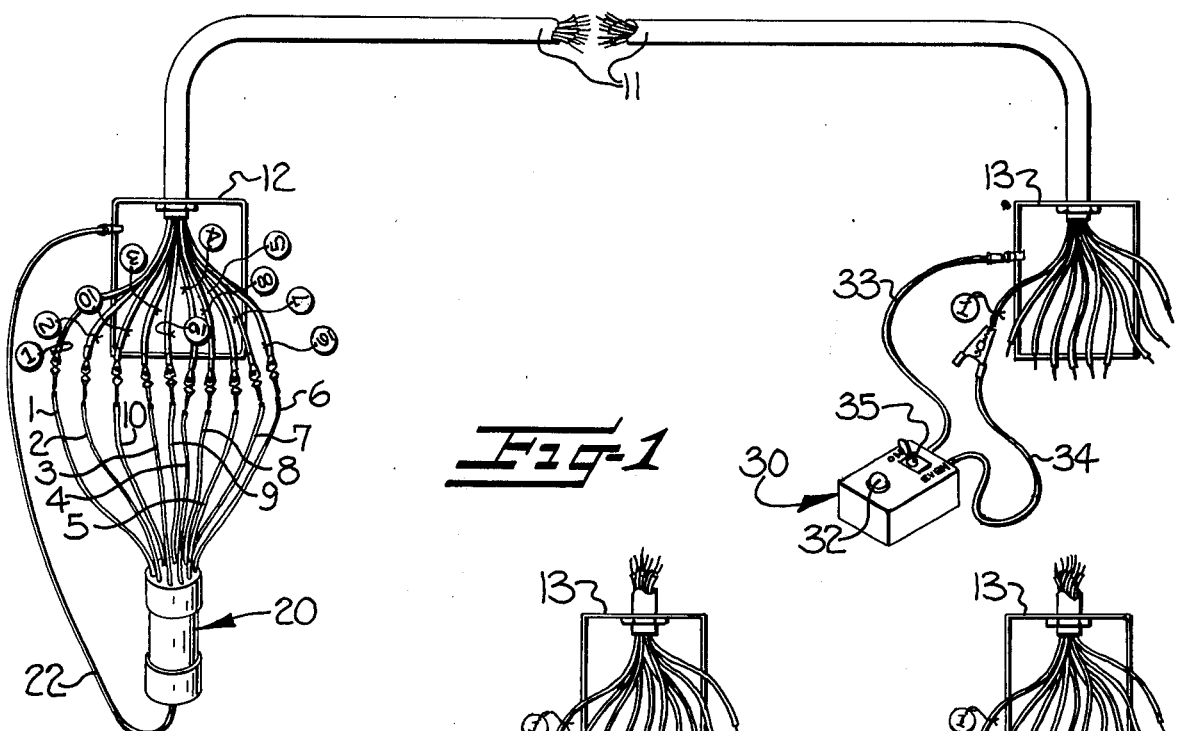
FIG. 1 is a view illustrating a conduit with a plurality of wires therein and showing how the device and method of the present invention is employed initially in identifying the opposite ends of a first one of the wires in the multi-wire conduit.
Figure 2:
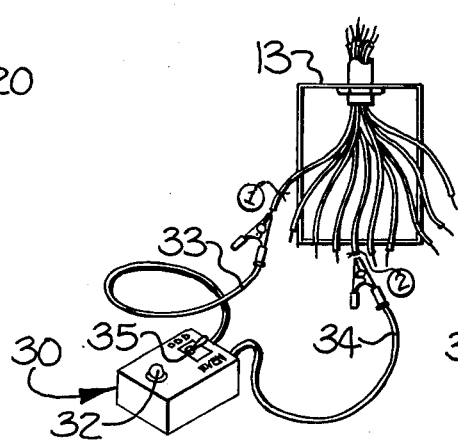
FIG. 2 is a view corresponding to the right-hand portion of FIG. 1 and showing how the device and method is employed for identifying a second wire of the conduit.
Figure 3:
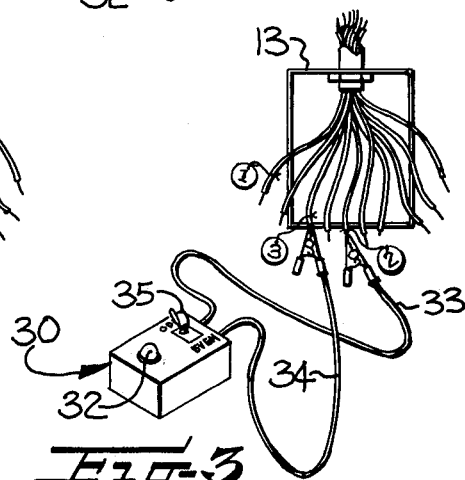
FIG. 3 is a view corresponding to the right-hand portion of FIG. 1 and showing how the device and method is employed for identifying a third wire of the circuit.

Referring now more particularly to the drawings, a conventional electrical conduit 11 is illustrated in FIG. 1 with junction boxes 12, 13 located at opposite ends of the conduit. Ten wires run through the conduit 11 with opposite end portions of the wires extending from the junction boxes 12 and 13. A diode assembly 20 is connected to the wires at one end of the conduit and a direct current circuit tester 30 is shown at the opposite end of the conduit.

Figure 6:
FIGS. 6 and 7 illustrates two types of conventional clips which may be employed for connecting the leads of the diode assembly and the circuit tester to the respective wires to be identified.
Figure 7:
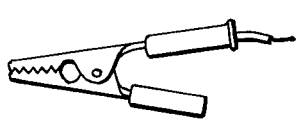

As illustrated, the diode assembly 20 has a plurality of leads, in this instance ten leads identified by the reference characters 1 to 10, extending from one end of a housing and a single lead 22 extending from the opposite end of the housing. Each lead is provided with means, such as a conventional alligator clip of the type illustrated in FIG. 6, to facilitate connecting the lead to a wire of the conduit. Each lead 1 to 10 has identification means thereon, which is applied thereto by labels or other suitable means, and which identifies the lead as corresponding to a particular one of the diodes in the diode assembly.

Figure 4:
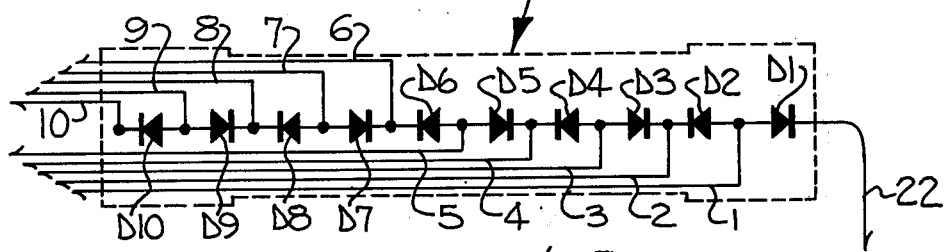
FIG. 4 is a schematic wiring diagram of the diode assembly.

The diodes in the diode assembly are electrically interconnected in a manner similar to that employed in the continuity tester of Sovient Union Description of Invention No. 130,580, published in 1960. Referring to FIG. 4, it will be seen that the housing of the diode assembly 20 contains ten diodes D1 to D10 electrically interconnected in series and in alternating polarity. The single lead 22 is connected to one of the leads of the first diode D1 of the series. To the other side of the diode D1 is connected the lead labeled as number 1. Similarly, corresponding leads of the remaining diodes D2 to D10 have correspondingly numbered leads 2 to 10 connected thereto.

Figure 5:
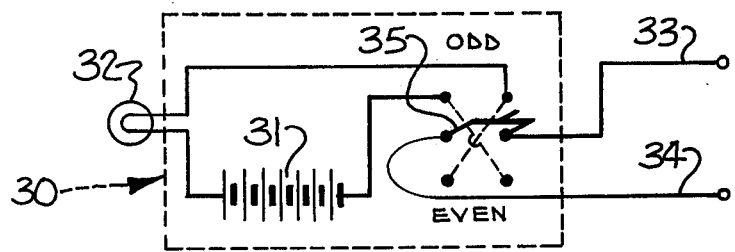
FIG. 5 is a schematic wiring diagram of the direct current circuit tester.

Referring now to the circuit tester 30, in the preferred form of the apparatus as illustrated herein the circuit tester includes a battery 31, an indicator 32 in the form of a lamp, buzzer or other suitable means, a pair of test leads 33 and 34 and a polarity reversing switch 35. In the illustrated embodiment each test lead is in the form of a wire provided with an alligator clip or other suitable means at the end thereof to facilitate connecting the lead to one of the wires of the conduit. However, if desired, a portion of the housing or the switch itself may be connected to the circuit and employed as a probe, thus serving as one or both of the test leads and eliminating one or both of the wires extending from the housing. As illustrated in FIG. 5, the battery 31, indicator 32, and test leads 33 and 34 are interconnected in series so as to be operable for actuating the indicator 32 upon the completion of the circuit between the test leads 33 and 34. The polarity reversing switch 35 is connected to the leads 33 and 34 in such a manner that the polarity of the leads may be reversed by throwing the switch from one position to another. The two positions of the switch are identified as "odd" and "even," the reasons which will become apparent as the description proceeds.

In performing the method of this invention, it is first necessary to install the diode assembly 20 at one end of the conduit. This is accomplished by connecting the unidentified wires to the respective leads 1 to 10 of the diode assembly 20 and connecting the single lead 22 to a common ground connection. As illustrated, the lead 22 is connected to the grounded junction box 12. However any known conductor will suffice. Thus, where the conduit 11 or the junction box 12 is of a nonconductive material, the lead 22 may besuitably connected to a previously identified bonding conductor or ground wire, such as is normally provided in the conduit during installation of the other wires pursuant to most code requirements.

The preferred practice in accordance with the invention is to label all of the wires at this end of the conduit at the time the diode assembly is installed. Numbered tags or self-adhesive labels may be suitably employed, the numbers preferably corresponding to the numbers of the respective leads 1 to 10. In a later step in the method similar labels will be applied to the corresponding opposite end portions of the wires at the opposite end of the conduit.

Once the diode assembly 20 is installed, the workman can go to the opposite end of the conduit and proceed to identify the wires using the circuit tester 30 in the manner described as follows:

One lead 33 of the circuit tester is connected to the common ground connection and the other lead 34 is applied individually and successively to the unidentified wires until the indicator 32 signals a complete circuit. The wire thus located corresponds to the wire labeled as number 1 at the opposite end of the conduit and may be appropriately labeled as such. The wire 33 which is connected to the ground must correspond in polarity to the polarity of the grounded side of the first diode D1. This is accomplished in the illustrated apparatusby setting the polarity reversing switch to "odd" since the wire being identified (number 1) is an odd number. It wll be seen from the schematic diagrams of FIGS. 4 and 5 that when the switch 35 is so positioned, both the lead 22 and the lead 33 are the same polarity.

After the first wire is thus identified, lead 33 is removed from the ground and connected to the wire just identified as wire number 1, and the polarity reversing switch 35 is moved from odd to even, since the wire now being located is an even number. The lead 34 is applied individually and successively to the remaining unidentified wires until a complete circuit is indicated, thus indicating a match with the wire connected to the second diode of the series, which is labeled number 2 at the opposite end of the conduit. A corresponding label may be applied to this wire and the preceeding steps are repeated until all of the remaining unidentified wires of the conduit have been identified. It will be appreciated that the labels may be applied at any suitable time during the identification sequence.

The device and method of this invention may be employed for identifying any number of wires. Thus, when the number of wires to be identified is less than the number of available leads on the diode assembly 20, only the lowest numbered leads are employed, the leads having numbers higher than the number of wires to be identified being left unconnected.

When the number of wires to be identified exceeds the available number of leads on the diode assembly 20, any number of additional diode assemblies may be connected in series to provide the requisite number of leads. This is accomplished, for example, by connecting the first diode assembly in the manner previously described, and connecting the single lead 22 of each additional diode assembly to the highest numbered lead (e.g. 10) of the previous diode assembly.

In accordance with the invention, an alternate construction for the circuit tester 30 may eliminate the polarity reversing switch 35. In this case, proper polarity of the leads 33 and 34 is maintained by interchanging the lead of the circuit tester applied to the unidentified wires and the lead of the circuit tester connected to the previously identified wire during each repetition of the procedure. Thus, upon the identification of a wire with one of the leads of the circuit tester, that lead is connected to the thus identified wire and the other lead of the circuit tester is removed from its previous connection and employed for testing the remaining unidentified wires. When a wire completing the circuit is located by this lead, the lead is connected to the thus identified wire and the other lead is then employed for testing the remaining unidentified wires. This procedure is repeated until all of the wires are identified.

In the drawings annd specification, there have been set forth preferred embodiments of the invention, and although specific terms are employed, they are used in a generic and descriptive sense only and not for purposes of limitation.

That which is claimed is:

1. A method for matching the corresponding opposite end portions of wires located at opposite ends of a multi-wire conduit with the use of a direct current circuit tester in conjunction with a plurality of diodes, the diodes having respective pairs of leads and being electriclly interconnected in series in alternating polarity, and the circuit tester including a battery, an indicator, and first and second leads connected thereto, with a polarity reversing switch connected to the leads for reversing the polarity of the leads, said method being particularly suited for practice by one person, thereby avoiding the necessity of having persons at both ends of the conduit, and said method comprising
    a. connecting corresponding leads of the respective series-interconnected diodes to a predetermined number of the wires at one end of the conduit,
    b. connecting the free lead of the first diode of the series to a common ground connection,
    c. connecting to the common ground connection at the opposite end of the conduit a first lead of the circuit tester having a polarity corresponding to the polarity of the grounded free end of the first diode,
    d. applying the second lead of the circuit tester to the unidentified wires at said opposite end of the conduit until a wire is located which completes the circuit on the circuit tester, thus indicating a match with the wire connected to the first diode of the series at said one end of the conduit,
    e. connecting the thus located wire to said first lead of the circuit tester,
    f. actuating the polarity reversing switch to thereby reverse the polarity of the leads of the circuit tester,
    g. applying said second lead of the circuit tester to the then remaining unidentified wires until a wire is located which completes the circuit on the circuit tester, thus indicating a match with the wire connected to the next diode of the series at said one end of the conduit, and
    h. repeating steps (e), (f) and (g) until all of the predetermined number of wires have been identified.

2. A method for matching and labeling the corresponding opposite end portions of wires located at opposite ends of a multi-wire conduit with the use of a direct current circuit tester in conjunction with a plurality of diodes, the diodes having respective pairs of leads and being electrically interconnected in series in alternating polarity, and the circuit tester including a battery, an indicator, and first and second leads connected thereto, with a polarity reversing switch connected to the leads for reversing the polarity of the leads, said method being particularly suited for practice by one person, thereby avoiding the necessity of having persons at both ends of the conduit, and said method comprising
    a. connecting corresponding leads of the respective series-interconnected diodes to a predetermined number of the wires at one end of the conduit,
    b. labeling the end portions of the thus connected wires with a series of identification labels corresponding, respectively, to the location of the diodes in the series,
    c. connecting the free lead of the first diode of the series to a common ground connection,
    d. connecting to the common ground connection at the opposite end of the conduit a first lead of the circuit tester having a polarity corresponding to the polarity of the grounded free lead of the first diode,
    e. applying the second lead of the circuit tester to the unidentified wires at said opposite end of the conduit until a wire is located which completes the circuit on the circuit tester,
    f. labeling the thus located wire with an identifying label corresponding to the first of the serially identified wires at said one end of the conduit,
    g. actuating the polarity reversing switch to thereby reverse the polarity of the leads of the circuit tester,
    h. connecting the thus located and labeled wire to said first lead of the circuit tester,
    i. applying the second lead of the circuit tester to the then remaining unidentified wires until a wire is located which completes the circuit on the circuit tester,
    j. labeling the thus located wire with a label corresponding to the next one of the serially identified wires at said one end of the conduit, and
    k. repeating steps (g), (h) (i) and (j) until all of the predetermined number of wires have been identified and labeled.

* * * * *

UNITED STATES PATENT OFFICE
CERTIFICATE OF CORRECTION

PATENT NO. : 4,041,383
DATED : August 9, 1977
INVENTOR(S) : James Lynn Howard

It is certified that error appears in the above-identified patent and that said Letters Patent are hereby corrected as shown below:

Column 1, Line 41, delete the slash "/" at the end of the line.
Column 2, Lines 4 and 5, delete "the lead of a first circuit tester" and insert --a first lead of the circuit tester--; Line 45, "spectivve" should be --spective--; Line 65 "panyingdrawings" should be --panying drawings--. Column 3, Line 10, "circuit" should be --conduit--; Line 42, "Sovient" should be --Soviet--; Line 53, "tester30" should be --tester 30--. Column 4, Line 7, "the" should be --for--; Line 18, "besuitably" should be -- be suitably--; Line 45, "apparatusby" should be --apparatus by--. Column 5, Line 32, "annd" should be --and--; Lines 42 and 43, CLAIM 1, "electriclly" should be --electrically--

Signed and Sealed this

Eighth Day of November 1977

[SEAL]

Attest:

RUTH C. MASON
Attesting Officer

LUTRELLE F. PARKER
Acting Commissioner of Patents and Trademarks